US011527509B2

(12) United States Patent
Lee et al.

(10) Patent No.: US 11,527,509 B2
(45) Date of Patent: Dec. 13, 2022

(54) SEMICONDUCTOR PACKAGE

(71) Applicant: Samsung Electronics Co., Ltd., Suwon-si (KR)

(72) Inventors: Sanghoon Lee, Seongnam-si (KR); Hyuekjae Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/364,541

(22) Filed: Jun. 30, 2021

(65) Prior Publication Data

US 2022/0139874 A1 May 5, 2022

(30) Foreign Application Priority Data

Oct. 29, 2020 (KR) .................. 10-2020-0142014

(51) Int. Cl.
*H01L 25/065* (2006.01)
*H01L 23/498* (2006.01)
(Continued)

(52) U.S. Cl.
CPC ........ *H01L 25/0652* (2013.01); *H01L 23/481* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/24* (2013.01); *H01L 24/08* (2013.01); *H01L 2224/08146* (2013.01);
(Continued)

(58) Field of Classification Search
CPC ............... H01L 25/0652; H01L 23/481; H01L 23/49816; H01L 23/49822; H01L 23/49833; H01L 23/49838; H01L 23/5385; H01L 23/5386; H01L 24/24; H01L 24/08; H01L 2224/08146; H01L 2224/08235; H01L 2224/24145; H01L 2224/24225; H01L 2225/06513; H01L 2225/06517; H01L 2225/0652; H01L 2225/06544; H01L 2225/06548; H01L 2924/1431; H01L 2924/1434
See application file for complete search history.

(56) References Cited

U.S. PATENT DOCUMENTS 9,129,935 B1 9/2015 Chandrasekar et al.
9,741,691 B2 8/2017 Lim et al.
(Continued)

*Primary Examiner* — Benjamin Tzu-Hung Liu
(74) *Attorney, Agent, or Firm* — Harness, Dickey & Pierce, P.L.C.

(57) ABSTRACT

A semiconductor package including a first semiconductor chip including a first semiconductor layer having a first forward surface having a first integrated circuit thereon and a first rear surface and a plurality of first through vias electrically connected to the first integrated circuit and including at least first and second groups of first through vias, a second semiconductor chip including a second integrated circuit electrically connected to the first group of first through vias, and a third semiconductor chip including third through vias electrically connected to the second group of first through vias, wherein the first group of first through vias transfer input/output signals of the first integrated circuit, and the second group of first through vias transfer power to the first integrated circuit, may be provided.

20 Claims, 13 Drawing Sheets

(51) Int. Cl.
*H01L 23/538* (2006.01)
*H01L 23/00* (2006.01)
*H01L 23/48* (2006.01)

(52) U.S. Cl.
CPC .............. *H01L 2224/08235* (2013.01); *H01L 2224/24145* (2013.01); *H01L 2224/24225* (2013.01); *H01L 2225/0652* (2013.01); *H01L 2225/06513* (2013.01); *H01L 2225/06517* (2013.01); *H01L 2225/06544* (2013.01); *H01L 2225/06548* (2013.01); *H01L 2924/1431* (2013.01); *H01L 2924/1434* (2013.01)

(56) References Cited

U.S. PATENT DOCUMENTS

| | | |
|---|---|---|
| 10,121,743 B2 | 11/2018 | Kamal et al. |
| 2012/0171814 A1* | 7/2012 | Choi .................. H01L 23/5226 257/E21.504 |
| 2013/0292844 A1* | 11/2013 | Oh ...................... H01L 25/0655 257/774 |
| 2018/0053730 A1 | 2/2018 | Shao et al. |
| 2018/0301443 A1* | 10/2018 | Kim .................... H01L 23/3121 |
| 2019/0252353 A1 | 8/2019 | Lattard et al. |
| 2019/0287868 A1 | 9/2019 | Zelikson |
| 2020/0203276 A1 | 6/2020 | Hiblot et al. |

* cited by examiner

SEMICONDUCTOR PACKAGE

CROSS-REFERENCE TO RELATED APPLICATION(S)

This application claims the benefit under 35 USC 119(a) of Korean Patent Application No. 10-2020-0142014 filed on Oct. 29, 2020 in the Korean Intellectual Property Office, the entire disclosure of which is incorporated herein by reference for all purposes.

BACKGROUND

The present inventive concepts relate to semiconductor packages.

Semiconductor packages installed in electronic apparatuses are required to have a small size, high performance, and a high capacity. In order to implement such requirements, research into and development of semiconductor packages in which semiconductor chips including through silicon vias (TSVs) are stacked in a vertical direction have been conducted.

SUMMARY

Example embodiments provide semiconductor packages in which a voltage drop is decreased, a switching time is shortened, and an occupied area is reduced or minimized.

According to some example embodiments, a semiconductor package may include a first semiconductor chip including a first semiconductor layer having a first forward surface and a first rear surface opposing the first forward surface, the first forward surface having a first integrated circuit thereon and a plurality of first through vias penetrating through the first semiconductor layer and electrically connected to the first integrated circuit, the plurality of first through vias including at least a first group of first through vias and a second group of first through vias, a second semiconductor chip on the first rear surface of the first semiconductor chip, the second semiconductor chip including a second semiconductor layer having a second forward surface and a second rear surface opposing the second forward surface, the second forward surface having a second integrated circuit thereon, the second integrated circuit electrically connected to the first group of first through vias and second through vias penetrating through the second semiconductor layer and electrically connected to the second integrated circuit, a third semiconductor chip on the first rear surface of the first semiconductor chip, the third semiconductor chip including a third semiconductor layer having a third forward surface and a third rear surface opposing the third forward surface and third through vias penetrating through at least parts of the third semiconductor layer and electrically connected to the second group of first through vias and a plurality of connection bumps on the second and third semiconductor chips and electrically connected to at least one of the second through vias and the third through vias. The first group of first through vias may be configured to transfer input/output signals of the first integrated circuit, and the second group of first through vias may be configured to transfer power to the first integrated circuit.

According to some example embodiments, a semiconductor package may include a first semiconductor chip including a first semiconductor layer having a first forward surface and a first rear surface opposing the first forward surface, the first forward surface having a first integrated circuit thereon and a plurality of first through vias penetrating through the first semiconductor layer and electrically connected to the first integrated circuit, the plurality of first through vias divided into at least a first group of first through vias and a second group of first through vias, a second semiconductor chip on the first rear surface of the first semiconductor chip, the second semiconductor chip including a second semiconductor layer having a second forward surface and a second rear surface opposing the second forward surface, the second forward surface having a second integrated circuit electrically connected to the first group of first through vias thereon and second through vias penetrating through the second semiconductor layer and electrically connected to the second integrated circuit, and a third semiconductor chip on the first rear surface of the first semiconductor chip, the third semiconductor chip including a third semiconductor layer having a third forward surface and a third rear surface opposing the third forward surface and third through vias penetrating through at least parts of the third semiconductor layer and electrically connected to the second group of first through vias. A width of the first semiconductor chip in a first direction parallel to the first rear surface may be equal to or greater than a sum of a width of the second semiconductor chip and a width of the third semiconductor chip in the first direction and the second group of first through vias and the third through vias are configured to supply power to the first integrated circuit.

According to some example embodiments, a semiconductor package may include a first semiconductor chip including a first semiconductor layer having a first forward surface and a first rear surface opposing the first forward surface, the first forward surface having a first integrated circuit thereon and a plurality of first through vias penetrating through the first semiconductor layer and electrically connected to the first integrated circuit, the plurality of first through vias including at least a first group of first through vias, a second group of first through vias, and a third group of first through vias, a second semiconductor chip including a second semiconductor layer, the second semiconductor chip being on the first semiconductor chip so that a second forward surface faces the first rear surface, the second semiconductor layer including the second forward surface and a second rear surface opposing the second forward surface, the second forward surface having a second integrated circuit electrically connected to the first group of first through vias thereon and second through vias penetrating through the second semiconductor layer and electrically connected to the second integrated circuit, a third semiconductor chip including a third semiconductor layer, the third semiconductor chip being on the first semiconductor chip so that a third forward surface faces the first rear surface, the third semiconductor chip including the third forward surface and a third rear surface opposing the third forward surface and third through vias penetrating through the third semiconductor layer and electrically connected to the second group of first through vias, and a fourth semiconductor chip including a fourth semiconductor layer, the fourth semiconductor layer being on the first semiconductor chip so that a fourth forward surface faces the first rear surface, the fourth semiconductor layer having the fourth forward surface and a fourth rear surface opposing the fourth forward surface, the fourth forward surface having a memory circuit electrically connected to the third group of first through vias thereon. The second semiconductor chip may be configured to transfer input/output signals of the first integrated circuit, the third semiconductor chip may be configured to supply power to the first integrated circuit, and the fourth semiconductor chip may be configured to provide cache information to the first integrated circuit.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, some example embodiments will be described with reference to the accompanying drawings.

Figure 1A:
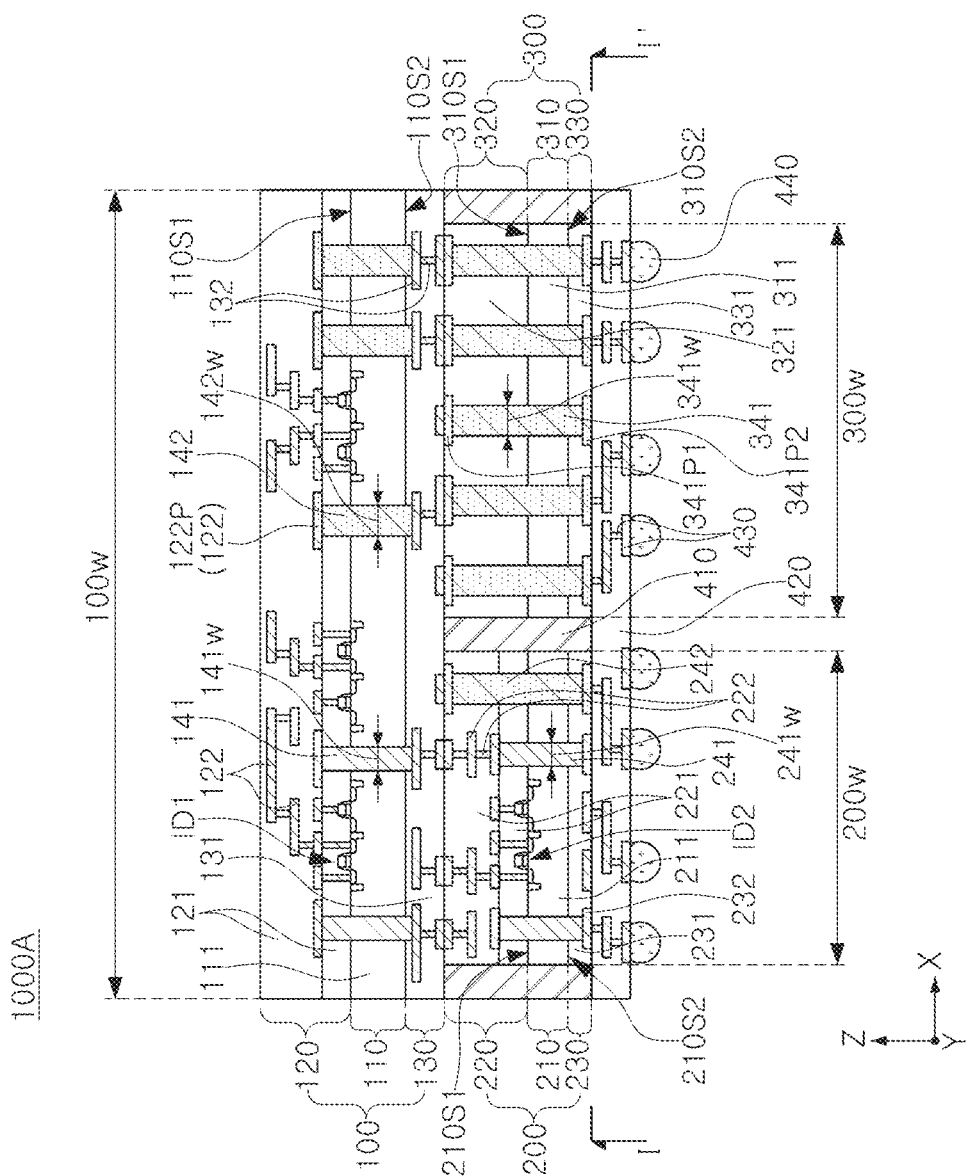
FIG. 1A is a view illustrating a semiconductor package according to an example embodiment.
Figure 1B:
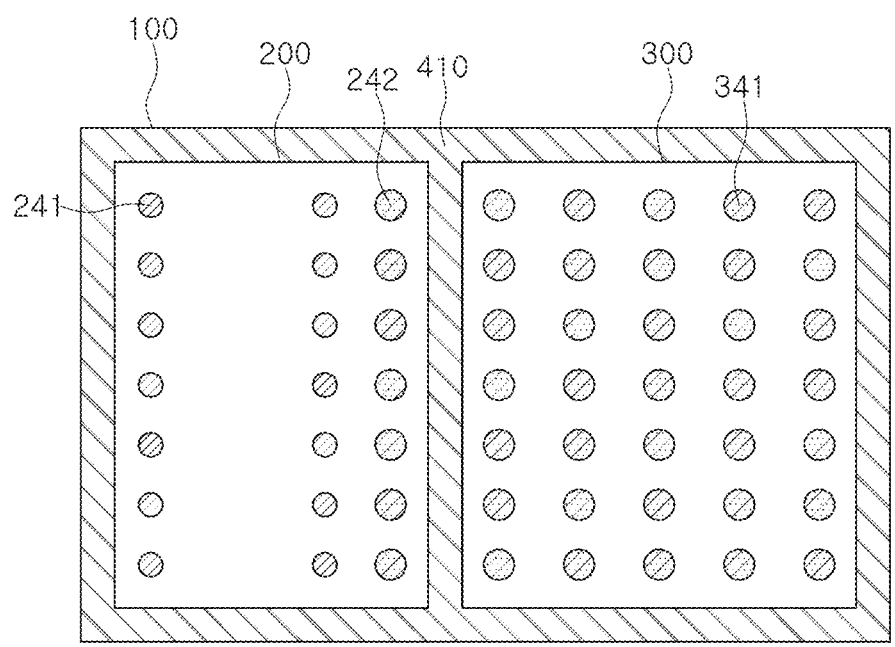
FIG. 1B is a view illustrating a plane cut along line I-I' of FIG. 1A.

FIG. 1A is a view illustrating a semiconductor package 1000A according to an example embodiment, and FIG. 1B is a view illustrating a plane cut along line I-I' of FIG. 1A. FIG. 1B illustrates the semiconductor package 1000A in a state in which a second wiring structure 232, a landing pad 341P2 and the like of FIG. 1A are omitted in order to represent a dispositional relationship between first to third semiconductor chips 100, 200, and 300 of the semiconductor package 1000A of FIG. 1A.

Referring to FIGS. 1A and 1B, the semiconductor package 1000A may include a first semiconductor chip 100 and second and third semiconductor chips 200 and 300 disposed on a lower surface of the first semiconductor chip 100. In addition, the semiconductor package 1000A may further include a first encapsulation layer 410, a second encapsulation layer 420, a redistribution structure 430, and a plurality of connection bumps 440. The first to third semiconductor chips 100, 200, and 300 may have a hybrid bonding structure in which they are attached directly to each other without using a separate connection member (e.g., a solder bump or a copper pillar). For example, the first semiconductor chip 100 and the second semiconductor chip 200 may be electrically connected to each other through a first wiring structure 132 and a second circuit structure 222, and the first wiring structure 132 may be in direct contact with the second circuit structure 222.

The first semiconductor chip 100 may receive input/output signals transferred through the second semiconductor chip 200 and may receive power supplied through the third semiconductor chip 300. In an example embodiment, a first group of first through vias 141 may transfer input/output signals of a first integrated circuit to the first integrated circuit or an external apparatus through second through vias 241 and a second integrated circuit. A second group of first through vias 142 may supply power to the first integrated circuit through third through vias 341. In an integrated circuit having an ultra-fine pitch, an input/output circuit and a power supplying circuit may increase a degree of congestion of the integrated circuit to cause a problem such as voltage drop. However, in an example embodiment, the second semiconductor chip 200 including an input/output circuit for the first semiconductor chip 100 and the third semiconductor chip 300 for supplying power for the first semiconductor chip 100 may be disposed on the first semiconductor chip 100 to decrease a degree of congestion of the first circuit structure 122 constituting the first integrated circuit of the first semiconductor chip 100. Therefore, a voltage drop of the first integrated circuit may be decreased and a switching time of the first integrated circuit may be shortened. In addition, the second and third semiconductor chips 200 and 300 may be positioned within an area of the first semiconductor chip 100, and an occupied area of the semiconductor package 1000A may thus be reduced or minimized. For example, in a direction (an X-axis direction) parallel to the lower surface or a first rear surface 110S2 of the first semiconductor chip 100, a width 100w of the first semiconductor chip 100 may be greater than the sum of a width 200w of the second semiconductor chip 200 and a width 300w of the third semiconductor chip 300.

The first semiconductor chip 100 may include a first semiconductor layer 110, a first circuit layer 120, a first wiring layer 130, and a plurality of first through vias 141 and 142. The first semiconductor layer 110 may have a first forward surface 110S1 on which the first integrated circuit is disposed and the first rear surface 110S2 opposing the first forward surface 110S1, and may include a semiconductor substrate 111, a plurality of conductive regions (not shown) formed in the semiconductor substrate 111, and isolation regions (not shown) formed in the semiconductor substrate 111 and on sides of the conductive regions. The semiconductor substrate 111 may be a semiconductor wafer. The semiconductor substrate 111 may include a semiconductor element such as silicon or germanium or a compound semiconductor such as silicon carbide (SiC), gallium arsenide (GaAs), indium arsenide (InAs), and indium phosphide (InP). The conductive region may be, for example, a well doped with impurities or a structure doped with impurities. The isolation region may be a device isolation structure having a shallow trench isolation (STI) structure, and may include silicon oxide.

The first circuit layer 120 may be disposed on the first forward surface 110S1 of the first semiconductor layer 110. The first circuit layer 120 may include a front interlayer insulating layer 121, a plurality of first individual devices ID1, and a first circuit structure 122 electrically connected to the plurality of first individual devices ID1. The front interlayer insulating layer 121 may be disposed on an upper surface of the semiconductor substrate 111 and may include silicon oxide or silicon nitride. The plurality of first individual devices ID1 may include various microelectronic devices such as a metal-oxide-semiconductor field effect transistor (MOSFET), a system large scale integration (LSI), a micro-electro mechanical systems (MEMS) device, an active element, and a passive element. The plurality of first individual devices ID1 may include a gate structure (not shown) disposed between the conductive regions of the semiconductor substrate 111.

The first circuit structure 122 may include one or more layers of wiring lines extending in a horizontal direction (the X-axis direction) and one or more layers of wiring vias extending in a vertical direction (a Z-axis direction) and formed in one or more layers, and may be electrically connected to at least one of the conductive regions on the semiconductor substrate 111 and the plurality of first individual devices ID1. The first circuit structure 122 may have a multilayer structure including a plurality of wiring lines and a plurality of wiring vias. Each of the wiring lines and the wiring vias may include, for example, a metal including aluminum (Al), gold (Au), cobalt (Co), copper (Cu), nickel (Ni), lead (Pb), tantalum (Ta), tellurium (Te), titanium (Ti), tungsten (W), or combinations thereof. A barrier film including titanium (Ti), titanium nitride (TiN), tantalum (Ta), or tantalum nitride (TaN) may be disposed between the wiring line or/and the wiring via and the interlayer insulating layer 121. The first circuit structure 122 may connect the first individual devices ID1 to each other or may connect the first individual devices ID1 and the first through vias 141 and 142 to each other, although not specifically illustrated in FIG. 1A.

The plurality of first individual devices ID1 and the first circuit structure 122 may be combined with each other to provide the first integrated circuit. The first integrated circuit may include a logic circuit. The logic circuit may include at least one of a central processing unit (CPU), a graphics processing unit (GPU), a field programmable gate array (FPGA), a digital signal processor (DSP), an image signal processor (ISP), an encryption processor, a microprocessor, a microcontroller, an analog-to-digital converter, or an application-specific integrated circuit (ASIC).

The first wiring layer 130 may be disposed on the first rear surface 110S2 of the first semiconductor layer 110. The first wiring layer 130 may include a rear interlayer insulating layer 131 and the first wiring structure 132 electrically connected to the first circuit structure 122. The rear interlayer insulating layer 131 may be disposed on a lower surface of the semiconductor substrate 111 and may include silicon oxide or silicon nitride. The first wiring structure 132 may have a single-layer structure or a multilayer structure. For example, the first wiring structure 132 may redistribute the first through vias 141 and 142 by including one or more layers of wiring lines and one or more layers of wiring vias, similar to the first circuit structure 122. A passivation film (not shown) may be further included on a lower surface of the first wiring layer 130. The passivation film may be an insulating layer including silicon oxide, silicon nitride, polymer, or combinations thereof. The passivation film may cover parts (e.g., rear pads) of the first wiring structure 132 exposed on the lower surface of the first semiconductor chip 100.

The plurality of first through vias 141 and 142 may penetrate through at least parts of the first semiconductor layer 110 and be electrically connected to the first integrated circuit, and may be divided into or may include at least first and second groups of first through vias 141 and 142. The plurality of first through vias 141 and 142 may electrically connect the first circuit structure 122 and the first wiring structure 132 to each other and provide transfer paths of input/output signals and power of the first integrated circuit. For example, the input/output signals of the first integrated circuit may be transferred to the first integrated circuit or an external apparatus through the first group of first through vias 141 connected to the second semiconductor chip 200. The first group of first through vias 141 may be connected to the second circuit structure 222 to electrically connect second individual devices ID2 and the first individual devices ID1 to each other. For example, the power of the first integrated circuit may be supplied to the first integrated circuit through the second group of first through vias 142 connected to the third semiconductor chip 300. The first through vias 142 of the second group may be connected to power rails 122P of the first circuit structure 122 that supplies power to the first individual devices ID1. The second group of first through vias 142 for supplying the power may have a size different from that of the first group of first through vias 141. For example, in the horizontal direction (the X-axis direction), a width 141w of the first group of first through vias 141 may be equal to or smaller than a width 142w of the second group of first through vias 142.

Each of the plurality of first through vias 141 and 142 may include a metal plug extending in the vertical direction (the Z-axis direction) between an upper surface and a lower surface of the first semiconductor chip 100 and a barrier film surrounding side surfaces of the metal plug. The metal plug may include, for example, tungsten (W), titanium (Ti), aluminum (Al), or copper (Cu). The metal plug may be formed by a plating process, a physical vapor deposition (PVD) process, or a chemical vapor deposition (CVD) process. The barrier film may include a metal compound such as tungsten nitride (WN), titanium nitride (TiN), or tantalum nitride (TaN). The barrier layer may be formed by a PVD process or a CVD process. A via insulating film may be formed on each of side surfaces of the plurality of first through vias 141 and 142. The via insulating film may be a single film or a multilayer film. The via insulating film may include silicon oxide, silicon oX-Ynitride, silicon nitride, polymer, or combinations thereof.

The second semiconductor chip 200 may be disposed on the lower surface or the first rear surface 110S2 of the first semiconductor chip 100, and may include a second semiconductor layer 210 having a second forward surface 210S1 and a second rear surface 210S2, a second circuit layer 220, a second wiring layer 230, and second through vias 241. The second semiconductor layer 210 may include a semiconductor substrate 211. The second wiring layer 230 may include a rear interlayer insulating layer 231 and the second wiring structure 232. The second semiconductor chip 200 may have technical characteristics that are same as or similar to those of the first semiconductor chip 100 described above, and an overlapping description thereof is thus omitted.

The second circuit layer 220 may include the second integrated circuit in which the plurality of second individual devices ID2 and the second circuit structure 222 are combined with each other. The second integrated circuit may be electrically connected to the first group of first through vias 141. The second semiconductor chip 200 may be disposed so that the second forward surface 210S1 on which the second integrated circuit is formed faces the first rear surface 110S2 of the first semiconductor chip 100. The second integrated circuit may include at least one of an input/output circuit, an analog circuit, a memory circuit, or a series-parallel conversion circuit for the first integrated circuit of the first semiconductor chip 100. The memory circuit may include at least one of a dynamic random access memory (DRAM), a static random access memory (SRAM), a phase changing random access memory (PRAM), a magnetic random access memory (MRAM), a resistive random access memory (RRAM), or a flash memory.

Further, the second semiconductor chip 200 may further include power through vias 242 configured to supply power to the second individual devices ID2. The power through vias 242 may supply the power to the second individual devices ID2 of the second integrated circuit. The power through vias 242 may supply the power to the second integrated circuit through a path via the first wiring structure 132 or/and the first circuit structure 122. In FIG. 1A, only single-layer wiring lines have been illustrated on the upper and lower surfaces of the power through via 242. In some example embodiments, the power through via 242 may be connected to the first wiring structure 132 and the redistribution structure 430 through a multilayer second circuit structure 222 or/and a multilayer second wiring structure 232, like the second through via 241. In an example embodiment, the second semiconductor chip 200 may be disposed so that the second forward surface 210S1 faces the first rear surface 110S2, and may receive the power supplied through the power through vias 242. Therefore, a degree of congestion of the second circuit structure 222 may be decreased, such that a voltage drop may be decreased and a switching time may be shortened.

The third semiconductor chip 300 may be disposed on the lower surface or the first rear surface 110S2 of the first semiconductor chip 100, and may include a third semiconductor layer 310 having a third forward surface 310S1 and a third rear surface 310S2, a third circuit layer 320, a third wiring layer 330, and third through vias 341. The third semiconductor layer 310 may include a semiconductor substrate 311. The third wiring layer 330 may include a rear interlayer insulating layer 331 and a third wiring structure 332. The third semiconductor chip 300 may have technical characteristics that are same as or similar to those of the first semiconductor chip 100 described above, and an overlapping description thereof is thus omitted.

The third circuit layer 320 may be disposed on the third forward surface 310S1 of the third semiconductor layer 310. The third circuit layer 320 may not include individual devices unlike the first and second circuit layers 120 and 220. The third circuit layer 320 may include a front interlayer insulating layer 321 surrounding each of the third through via 341. The front interlayer insulating layer 321 may include silicon oxide or silicon nitride. In FIG. 1A, thicknesses of the third semiconductor layer 310, the third circuit layer 320, and the third wiring layer 330 have been illustrated to be similar to those of the second semiconductor layer 210, the second circuit layer 220, and the second wiring layer 230 of the second semiconductor chip 200, respectively, but example embodiments are limited thereto. In an example embodiment, a thickness of the third semiconductor layer 310 may be greater than that of the third circuit layer 320 or the third wiring layer 330.

The third through vias 341 may penetrate through at least parts of the third semiconductor layer 310 and be electrically connected to the second group of first through vias 142. The third through vias 341 may supply the power to the first individual devices ID1 through the second group of first through vias 142. The third through via 341 for supplying the power may have a size different from that of the second through via 241. For example, in the direction (the X-axis direction) parallel to the lower surface or the first rear surface 110S2 of the first semiconductor chip 100, a width 241w of the second through via 241 may be equal to or smaller than a width 341w of the third through via 341. In FIG. 1A, only single-layer landing pads 341P1 and 341P2 have been illustrated on upper and lower surfaces of the third through via 341. In some example embodiments, the third through via 341 may be connected to the first wiring structure 132 and the redistribution structure 430 through multilayer circuits or wirings.

The first encapsulation layer 410 may be disposed on the lower surface or the first rear surface 110S2 of the first semiconductor chip 100, and may cover side surfaces of each of the second and third semiconductor chips 200 and 300. The first encapsulation layer 410 may fill a space between the second semiconductor chip 200 and the third semiconductor chip 300 spaced apart from each other in a first direction (the X-axis direction). The first encapsulation layer 410 may include an insulating material. For example, the first encapsulation layer 410 may include a material such as silicon oxide, silicon oX-Ynitride, silicon nitride, or polymer.

The second encapsulation layer 420 may be disposed vertically (e.g., in a first direction perpendicular to the first forward surface 110S1) between the plurality of connection bumps 440 and the first encapsulation layer 410, and horizontally (e.g., in a second direction perpendicular to the first direction) between the second semiconductor chip 200 and the third semiconductor chip 300. The second encapsulation layer 420 may include an insulating material, or may include a material different from that of the first encapsulation layer 410 in order to form the redistribution structure 430. For example, the second encapsulation layer 420 may include at least one of a thermosetting resin such as an epoxy resin, a thermoplastic resin such as polyimide, a prepreg, Ajinomoto Build-up Film (ABF), FR-4, Bismaleimide Triazine (BT), epoxy molding compound (EMC) that include an inorganic filler or/and a glass fiber, or a photoimagable dielectric (PID).

The redistribution structure 430 may electrically connect the plurality of connection bumps 440 to the second semiconductor chip 200 and the third semiconductor chip 300, and may be disposed in the second encapsulation layer 420. The redistribution structure 430 may include one or more layers of redistribution lines extending in the horizontal direction (an X-axis or Y-axis direction) and one or more layers of redistribution vias extending in the vertical direction (the Z-axis direction). The redistribution structure 430 may have a single-layer structure or a multilayer structure. In an example embodiment, the redistribution structure 430 may be omitted. In the disclosed example embodiment, the plurality of connection bumps 440 may be disposed directly on lower surfaces of the second and third semiconductor chips 200 and 300.

The plurality of connection bumps 440 may be disposed on the second and third semiconductor chips 200 and 300, and may be electrically connected to at least one of the second through vias 241 or the third through vias 341. The plurality of connection bumps 440 may be disposed on a lower surface of the second encapsulation layer 420, and may be electrically connected to the second through vias 241, the power through vias 242, and the third through vias 341. The plurality of connection bumps 440 may be disposed to face the lower surface or the first rear surface 110S2 of the first semiconductor chip 100. At least some connection bumps 440 connected to the power through vias 242 and the third through vias 341 may transfer power and ground signals from or to an external apparatus. The power through vias 242 and the third through vias 341 may be used as ground vias. The other connection bumps 440 connected to the second through vias 241 may transmit input/output signals from or to an external apparatus. Each of the plurality of connection bumps 440 may include a conductive material, and may have a land, ball, or pin structure.

Figure 2:
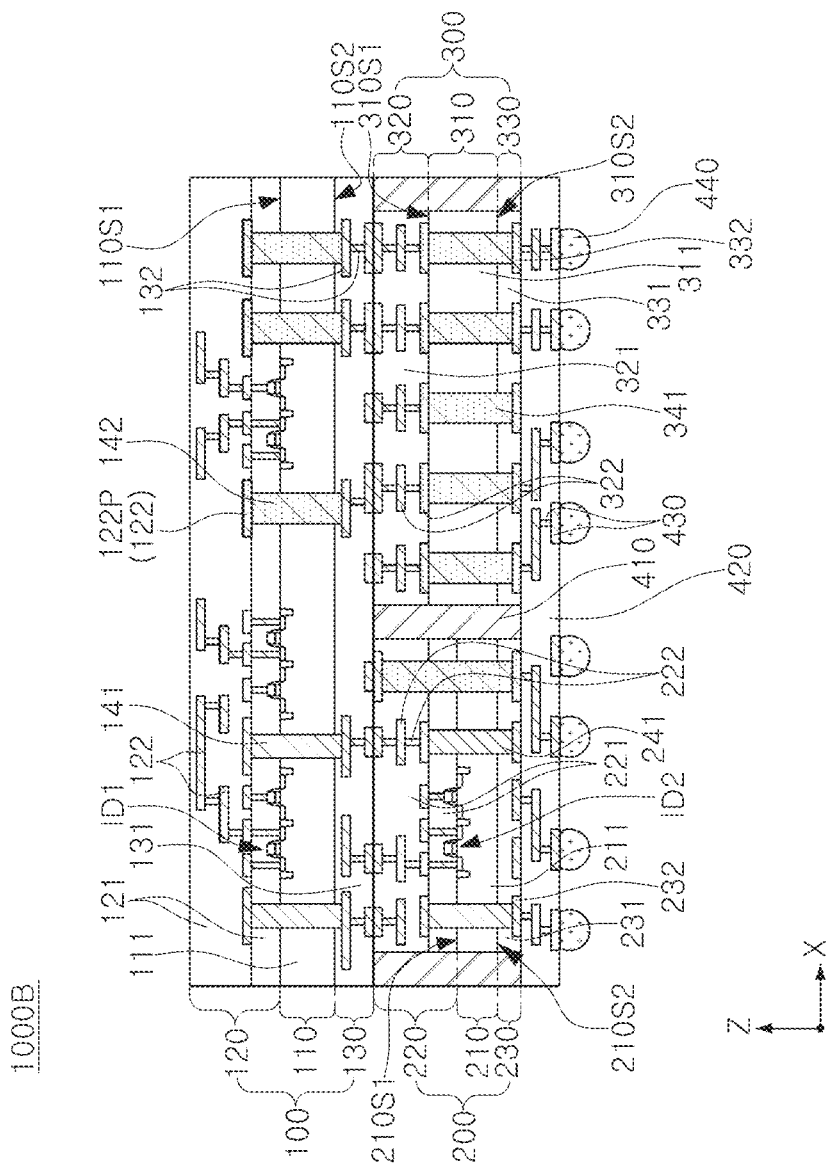
FIG. 2 is a view illustrating a semiconductor package according to an example embodiment.

FIG. 2 is a view illustrating a semiconductor package 1000B according to an example embodiment. In FIG. 2, components having the same reference numerals as those of FIG. 1A have characteristics that are the same as or similar to those described above, and an overlapping description thereof is thus omitted.

Referring to FIG. 2, in the semiconductor package 1000B, the third semiconductor chip 300 may be disposed so that the third forward surface 310S1 faces the first rear surface 110S2, and may further include a third circuit structure 322 electrically connecting the third through vias 341 and the second group of first through vias 142 to each other. In an example embodiment, the third semiconductor chip 300 may include a third semiconductor layer 310, a third circuit layer 320 disposed on the third forward surface 310S1 of the third semiconductor layer 310, and a third wiring layer 330 disposed on the third rear surface 310S2 of the third semiconductor layer 310. The third circuit layer 320 may include the third circuit structure 322 connecting the third through vias 341 and the first wiring structure 132 of the first semiconductor chip 100 to each other. The third circuit structure 322 may electrically connect the third through vias 341 and the second group of first through vias 142 to each other. The third circuit structure 322 may have a single-layer structure or a multilayer structure. The third wiring structure 332 in the third wiring layer 330 has been illustrated as a single layer in FIG. 2, but the third wiring structure 332 may also be formed in a multilayer structure like the third circuit structure 322. By redistributing the third through vias 341 using the third circuit structure 322 or/and the third wiring structure 332 as described above, a degree of freedom in a design of power lines of the first semiconductor chip 100 and the third semiconductor chip 300 may be improved.

Figure 3:
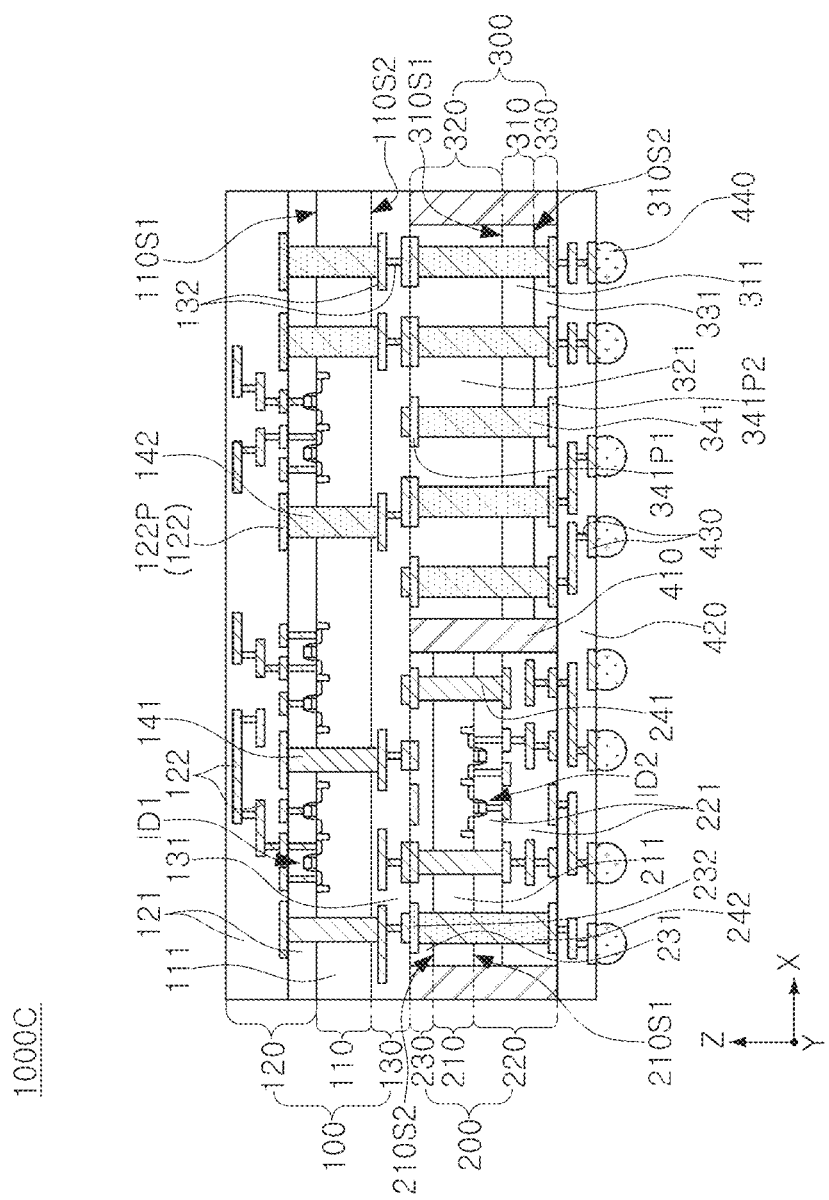
FIG. 3 is a view illustrating a semiconductor package according to an example embodiment.

FIG. 3 is a view illustrating a semiconductor package 1000C according to an example embodiment. In FIG. 3, components having the same reference numerals as those of FIG. 1A have characteristics that are the same as or similar to those described above, and an overlapping description thereof is thus omitted.

Referring to FIG. 3, in the semiconductor package 1000C, the second semiconductor chip 200 may be disposed so that the second rear surface 210S2 faces the first rear surface 110S2 of the first semiconductor chip 100. In an example embodiment, in the second semiconductor chip 200, the second wiring layer 230 may be in contact with the first wiring layer 130, and the second integrated circuit in the second circuit layer 220 may be connected to the first integrated circuit of the first semiconductor chip 100 through the second through vias 241 and the second wiring structure 232. The second individual devices ID2 may be electrically connected to the first semiconductor chip 100 through the second circuit structure 222 and the second through vias 241.

Figure 4:
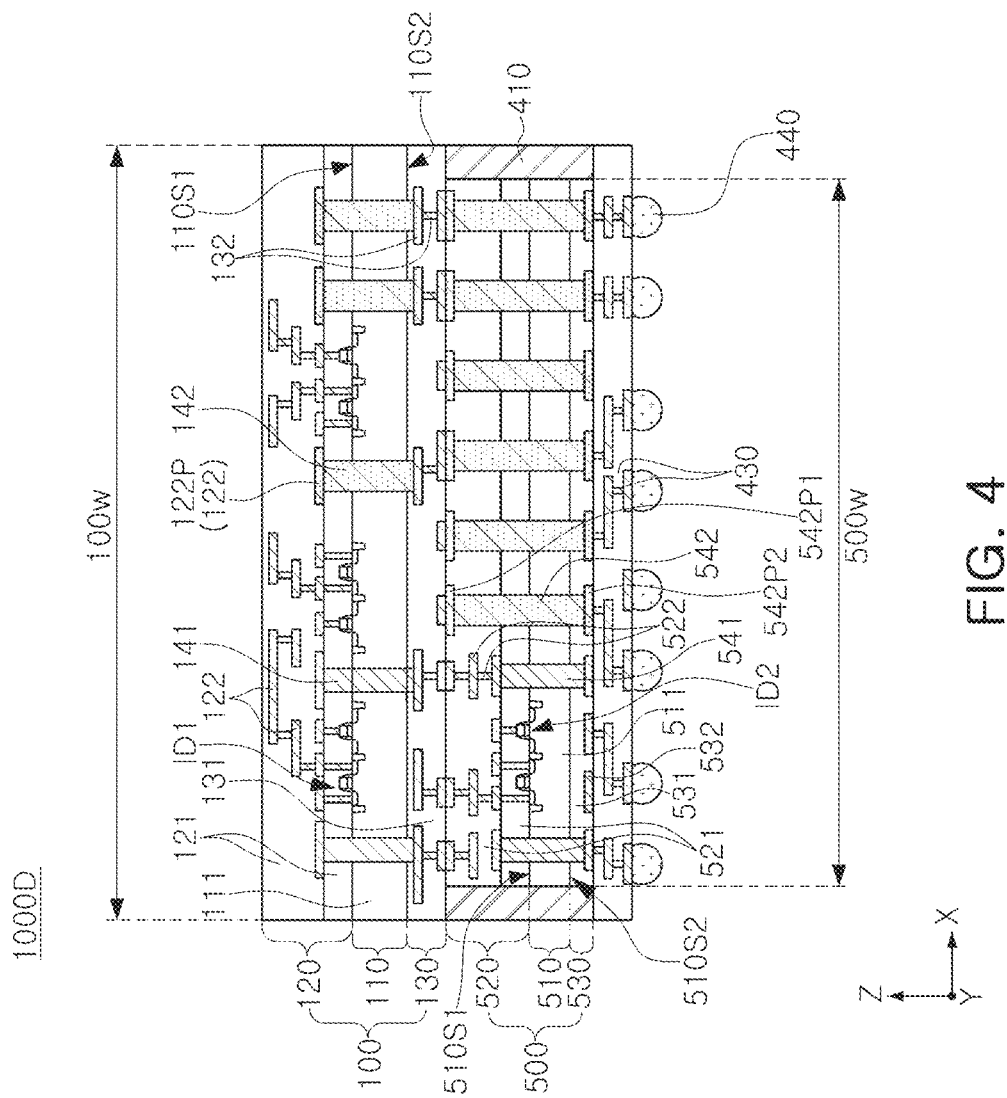
FIG. 4 is a view illustrating a semiconductor package according to an example embodiment.

FIG. 4 is a view illustrating a semiconductor package 1000D according to an example embodiment. In FIG. 4, components having the same reference numerals as those of FIG. 1A have characteristics that are the same as or similar to those described above, and an overlapping description thereof is thus omitted.

Referring to FIG. 4, in the semiconductor package 1000D, the second and third semiconductor chips 200 and 300 of FIG. 1A and the like may be provided as an integral semiconductor structure 500, and a width 100w of the first semiconductor chip 100 in the first direction (the X-axis direction) may be different from a width 500w of the semiconductor structure 500 in the first direction. In an example embodiment, the semiconductor structure 500 may be attached onto the first semiconductor chip 100 in a wafer state before a dicing process, and the width 500w of the semiconductor structure 500 may thus be smaller than the width 100w of the first semiconductor chip 100 after the dicing process. Side surfaces of the semiconductor structure 500 may be covered with the first encapsulation layer 410.

In an example embodiment, the semiconductor structure 500 may include a semiconductor layer 510 having a forward surface 510S1 and a rear surface 510S2, a circuit layer 520 disposed on the forward surface 510S1 of the semiconductor layer 510 and including a circuit structure 522, and a wiring layer 530 disposed on the rear surface 510S2 of the semiconductor layer 510, and a first group of through vias 541 and a second group of through vias 542, and upper landing pads 542P1 and lower landing pads 542P2. The semiconductor layer semiconductor layer 510 may include a semiconductor substrate 511. The circuit layer 520 may include a front interlayer insulating layer 521. The wiring layer 530 may include a rear interlayer insulating layer 531 and a wiring structure 532. In the semiconductor structure 500, elements having reference numerals similar to those of the second and third semiconductor chips 200 and 300 of FIG. 1A may have technical characteristics that are same as or similar to those of the second and third semiconductor chips 200 and 300. For example, the semiconductor layer 510 of the semiconductor structure 500 may correspond to the second and third semiconductor layers 210 and 310, the circuit layer 520 of the semiconductor structure 500 may correspond to the second and third circuit layers 220 and 320, and the wiring layer 530 of the semiconductor structure 500 may correspond to the second and third wiring layers 230 and 330. The semiconductor structure 500 may include an input/output circuit and a power circuit for the first semiconductor chip 100.

Figure 5:
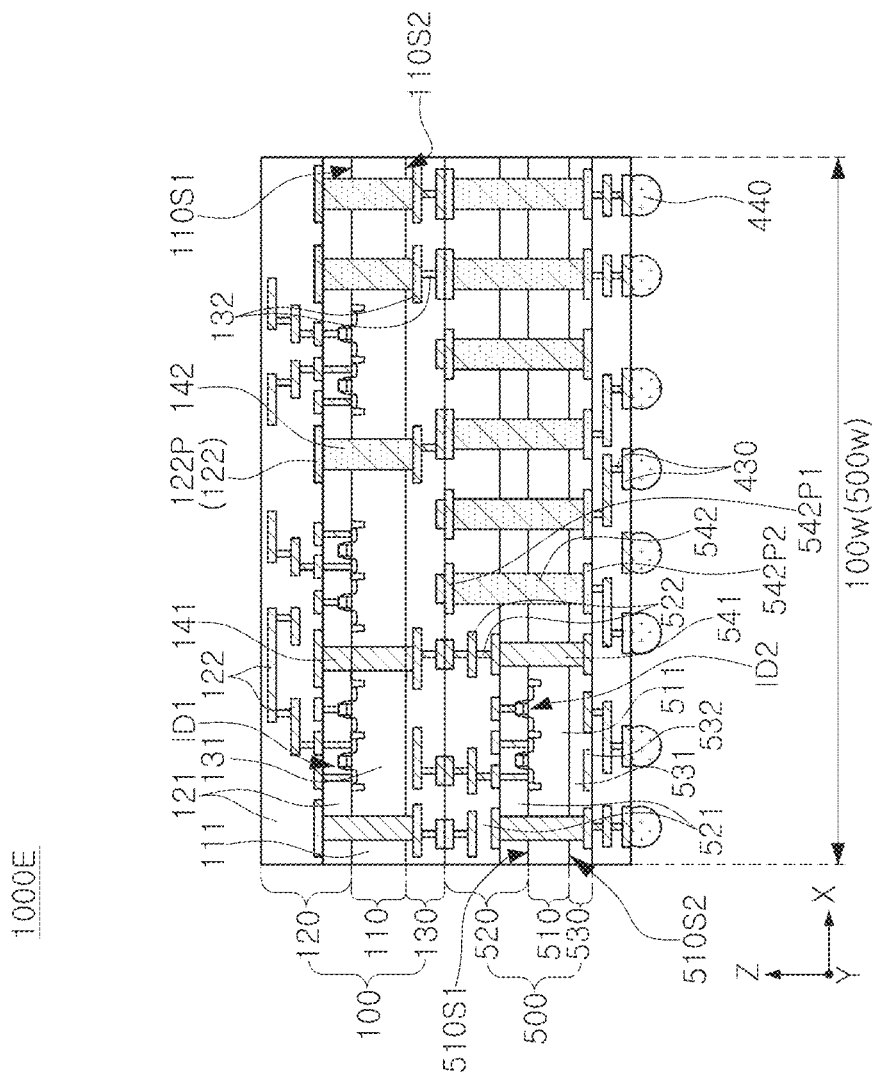
FIG. 5 is a view illustrating a semiconductor package according to an example embodiment.

FIG. 5 is a view illustrating a semiconductor package 1000E according to an example embodiment. In FIG. 5, components having the same reference numerals as those of FIGS. 1A and 4 have characteristics that are the same as or similar to those described above, and an overlapping description thereof is thus omitted.

Referring to FIG. 5, in the semiconductor package 1000E, the second and third semiconductor chips 200 and 300 of FIG. 1A and the like may be provided as an integral semiconductor structure 500, but a width 100w of the first semiconductor chip 100 in the first direction (the X-axis direction) may be the same as a width 500w of the semiconductor structure 500 in the first direction unlike the example embodiment illustrated in FIG. 4. In an example embodiment, the semiconductor structure 500 and the first semiconductor chip 100 may be bonded to each other in a wafer state before a dicing process. Therefore, the first semiconductor chip 100 and the semiconductor structure 500 may be cut at the same time in the dicing process, and widths 100w and 500w of the first semiconductor chip 100 and the semiconductor structure 500 may be thus the same as each other.

Figure 6:
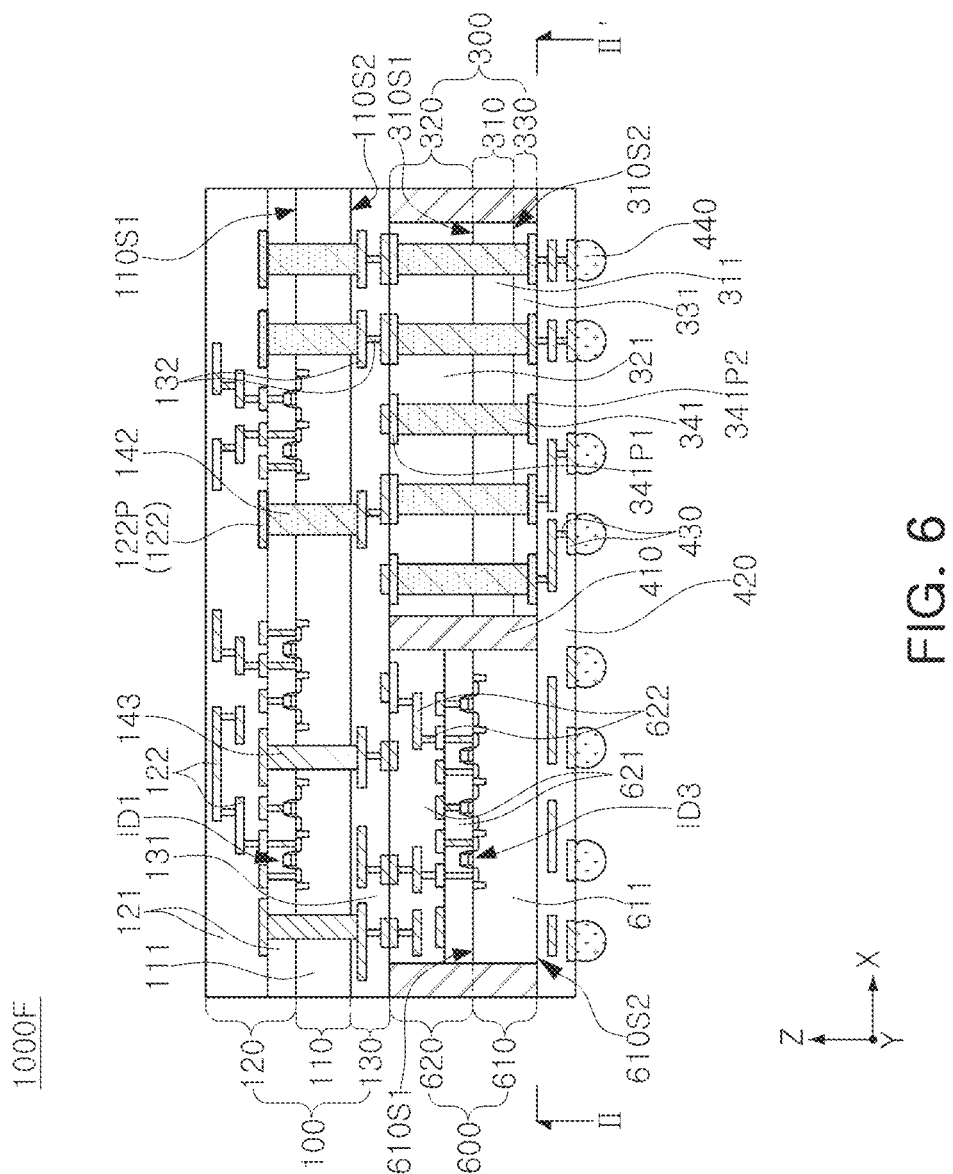
FIG. 6 is a view illustrating a semiconductor package according to an example embodiment.
Figure 7:
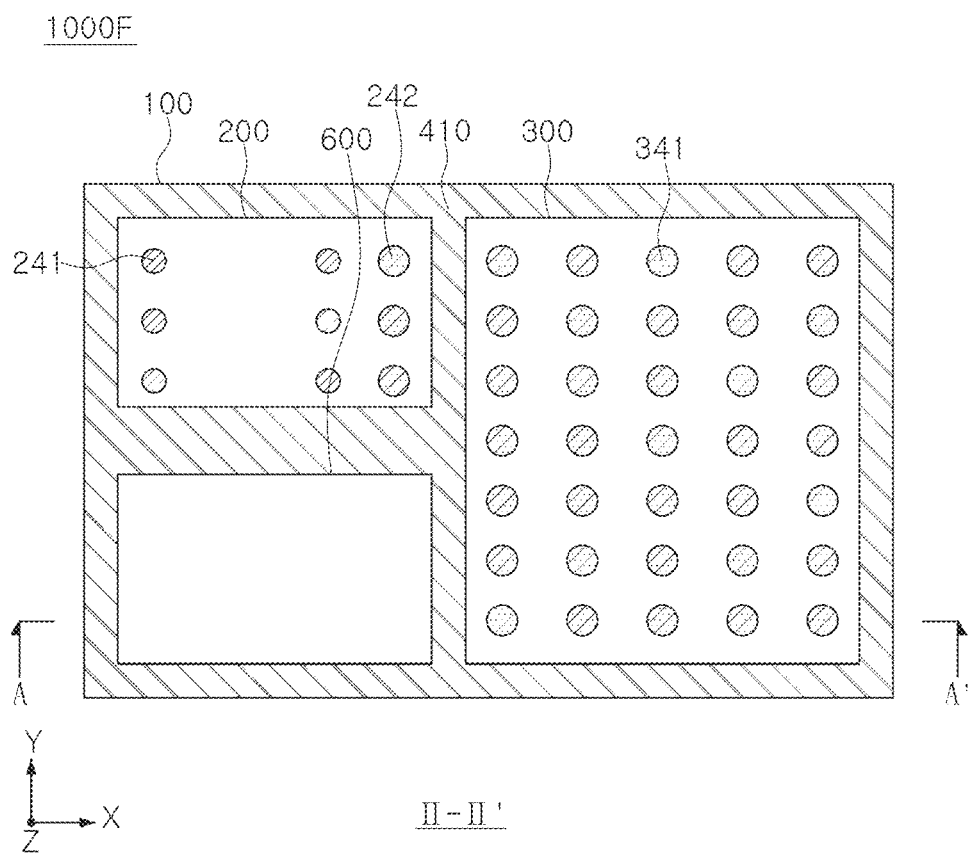
FIG. 7 is a view illustrating a plane cut along line II-II' of FIG. 6.

FIG. 6 is a view illustrating a semiconductor package 1000F according to an example embodiment, and FIG. 7 is a view illustrating a plane cut along line II-II' of FIG. 6. FIG. 6 is a cross-sectional view taken along line A-A' of FIG. 7. FIG. 7 illustrates the semiconductor package 1000F in a state in which a landing pad 341P2 and the like of FIG. 6 are omitted in order to represent a dispositional relationship between first to fourth semiconductor chips 100, 200, 300, 600 on an X-Y plane.

Referring to FIGS. 6 and 7, the semiconductor package 1000F may further include a fourth semiconductor chip 600 disposed on the lower surface or the first rear surface 110S2 of the first semiconductor chip 100 and including a fourth semiconductor layer 610 having a fourth forward surface 610S1 and a fourth rear surface 610S2 opposing the fourth forward surface 610S1 and a fourth circuit layer 620 disposed on the fourth forward surface 610S1 and including a memory circuit. The fourth semiconductor layer 610 may include a semiconductor substrate 611. The fourth circuit layer 620 may include a front interlayer insulating layer 621. In an example embodiment, the fourth semiconductor chip 600 may be disposed on the first semiconductor chip 100 so that the fourth forward surface 610S1 faces the first rear surface 110S2. On the X-Y plane, the second, third, and fourth semiconductor chips 200, 300, and 600 may be disposed in the first semiconductor chip 100. The fourth semiconductor chip 400 may have technical characteristics that are same as or similar to those of the second semiconductor chip 200 described above, and an overlapping description thereof is thus omitted.

The fourth circuit layer 620 may include a plurality of third individual devices ID3 and a third circuit structure 622. The plurality of third individual devices ID3 and the third circuit structure 622 may be combined with each other to provide a memory circuit. The memory circuit may be electrically connected to the first semiconductor chip 100. In an example embodiment, the first semiconductor chip 100 may further include third group of first through vias 143, and the third group of first through vias 143 may electrically connect the first integrated circuit and the memory circuit to each other. The memory circuit may include at least one of a DRAM, an SRAM, a PRAM, an MRAM, an RRAM, or a flash memory. For example, the memory circuit may include a cache memory circuit providing cache information to the first semiconductor chip 100. In example embodiments, the fourth semiconductor chip 600 may not include a through via penetrating through the fourth semiconductor layer 610, and the memory circuit on the fourth semiconductor layer 610 may be electrically insulated from the plurality of connection bumps 440 and the redistribution structure 430.

Figure 8A:
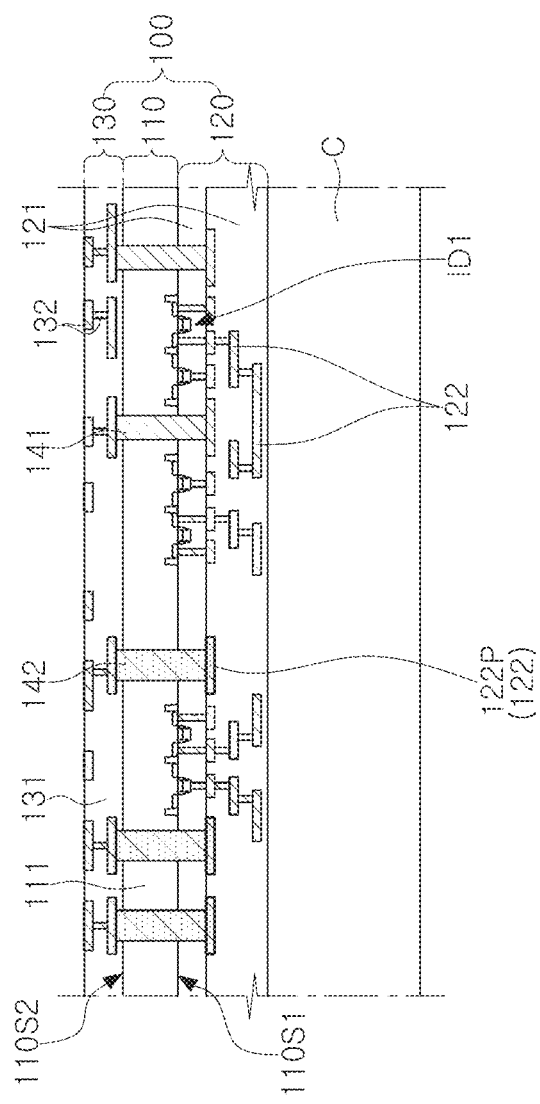
FIGS. 8A to 8C are schematic views illustrating a method of manufacturing the semiconductor package of FIG. 1A.
Figure 8B:
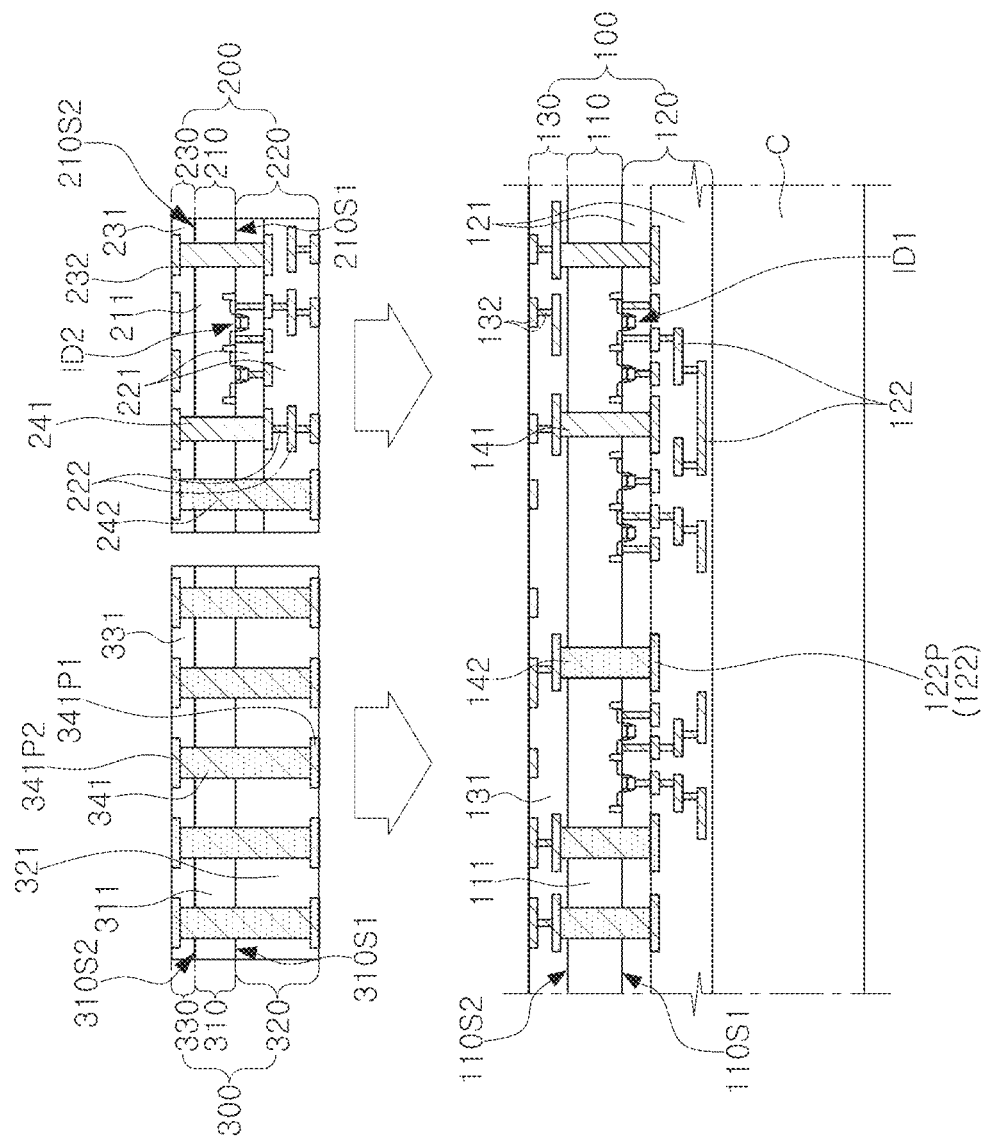
Figure 8C:
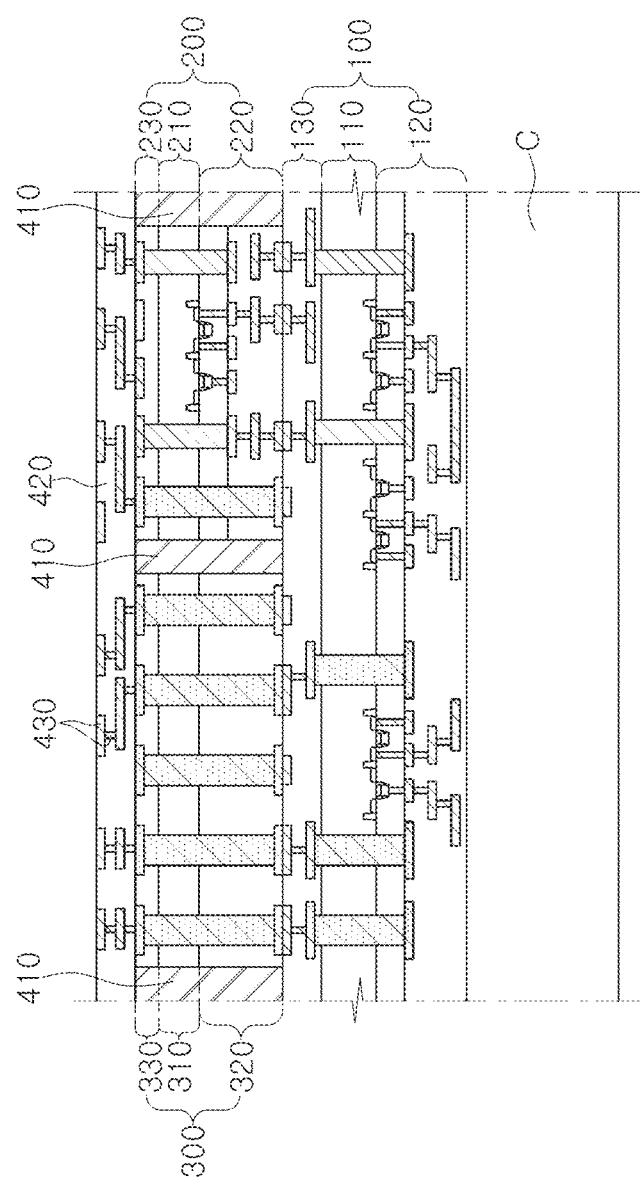

FIGS. 8A to 8C are schematic views illustrating a method of manufacturing the semiconductor package 1000 of FIG. 1A.

Referring to FIG. 8A, the first semiconductor chip 100 in a wafer state may be disposed on a carrier C. The first semiconductor chip 100 may be disposed so that the first forward surface 110S1 faces the carrier C. The carrier (C) may be a resin substrate or a glass substrate including an adhesive layer. In an example embodiment, the carrier C may be a dummy wafer. The first wiring layer 130 of the first semiconductor chip 100 exposed on the carrier C may include a first rear interlayer insulating layer 131 and a first wiring structure 132. The first rear interlayer insulating layer 131 may include a silicon oxide film. The first wiring structure 132 may include multilayer wiring lines and wiring vias. The first wiring layer 130 may be formed by removing parts of the first semiconductor layer 110 by a chemical mechanical polishing (CMP) process or the like and then repeatedly performing a photolithography process, an etching process, a plating process, and the like.

Referring to FIG. 8B, a diced second semiconductor chip 200 and third semiconductor chip 300 may be attached onto the first rear surface 110S2 of the first semiconductor chip 100 in the wafer state. The second and third semiconductor chips 200 and 300 may be disposed so that the second forward surface 210S1 and the third forward surface 310S1 face the first rear surface 110S2 of the first semiconductor chip 100, respectively. The second and third semiconductor chips 200 and 300 may be bonded directly to the first semiconductor chip 100 without using separate adhesive members and connection members. For example, the first rear interlayer insulating layer 131 and second and third front interlayer insulating layers 221 and 321 may be compressed and bonded to each other, and be then heated to bond the first wiring structure 132 to the second circuit structure 222 and the landing pads 341P1 of the third through vias 341, which are in contact with each other.

Referring to FIG. 8C, the first encapsulation layer 410 filling the space between the second and third semiconductor chips 200 and 300 may be formed, and the second encapsulation layer 420 and the redistribution structure 430 may be formed on the second and third semiconductor chips 200 and 300. The first encapsulation layer 410 may be formed of a gap fill material such as oxide or nitride, and the second encapsulation layer 420 may be formed of a photosensitive resin such as PID. The redistribution structure 430 may be formed by performing a photolithography process, a plating process, or the like. Then, individual semiconductor packages may be separated in a sawing process, and connection bumps may be formed on the redistribution structure 430 (for example, pad portions) exposed on the second encapsulation layer 420 to complete the semiconductor package.

Figure 9:
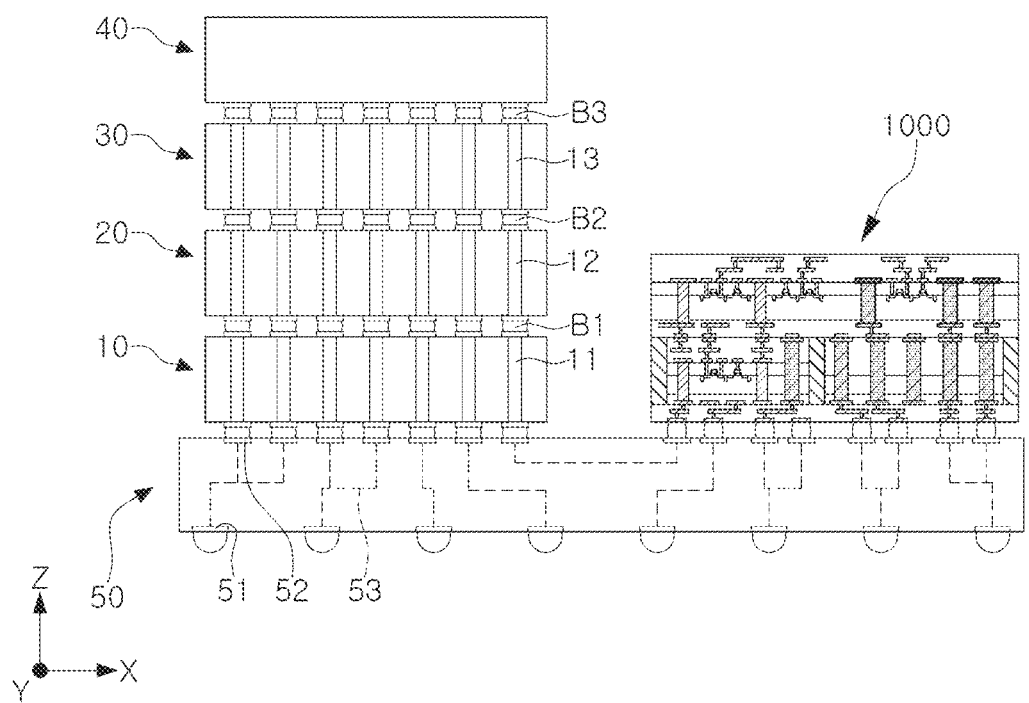
FIG. 9 is a view illustrating a semiconductor package according to an example embodiment.

FIG. 9 is a view illustrating a semiconductor package 2000A according to an example embodiment.

Referring to FIG. 9, the semiconductor package 2000A may include a main semiconductor structure 1000 and a plurality of semiconductor chips 10, 20, 30, and 40 disposed on a mounting substrate 50. The main semiconductor structure 1000 may include at least one of the semiconductor packages 1000A to 1000F of FIGS. 1A to 7 described above. The plurality of semiconductor chips 10, 20, 30, and 40 may be stacked in the vertical direction (the Z-axis direction) on the mounting substrate 50.

The mounting substrate 50 may include lower terminals 51 and upper terminals 52 disposed on a lower surface and an upper surface thereof, respectively, and connection wirings 53 electrically connecting the lower terminals 51 and the upper terminals 52 to each other. The mounting substrate 50 may be a substrate for a semiconductor package such as a printed circuit board (PCB), a ceramic substrate, or a tape wiring board. For example, the mounting substrate 50 may be a silicon interposer substrate including through silicon vias (TSVs). The connection wirings 53 may electrically connect the main semiconductor structure 1000 and the plurality of semiconductor chips 10, 20, 30, and 40 to each other.

The main semiconductor structure 1000 may be a process unit such as a CPU or GPU. The main semiconductor structure 1000 may be a package whose normal operation has been verified (e.g., a known good package (KGP)). The main semiconductor structure 1000 may be electrically connected to the mounting substrate 50 through a connection member.

The plurality of semiconductor chips 10, 20, 30, and 40 may be electrically connected to each other through vias 11, 12, and 13 and connection bumps B1, B2, and B3. The plurality of semiconductor chips 10, 20, 30, 40 may include a volatile memory chip such as a DRAM or a nonvolatile memory chip such as a PRAM, an MRAM, an RRAM, and a flash memory. The plurality of semiconductor chips 10, 20, 30, and 40 may be in a form in which they are packaged using a buffer chip, a molding member and the like. The plurality of semiconductor chips 10, 20, 30, and 40 may also have a hybrid bonding structure in which landing pads of the through vias 11, 12, and 13 are in direct contact with each other without using the connection bumps B1, B2, and B3.

Figure 10:
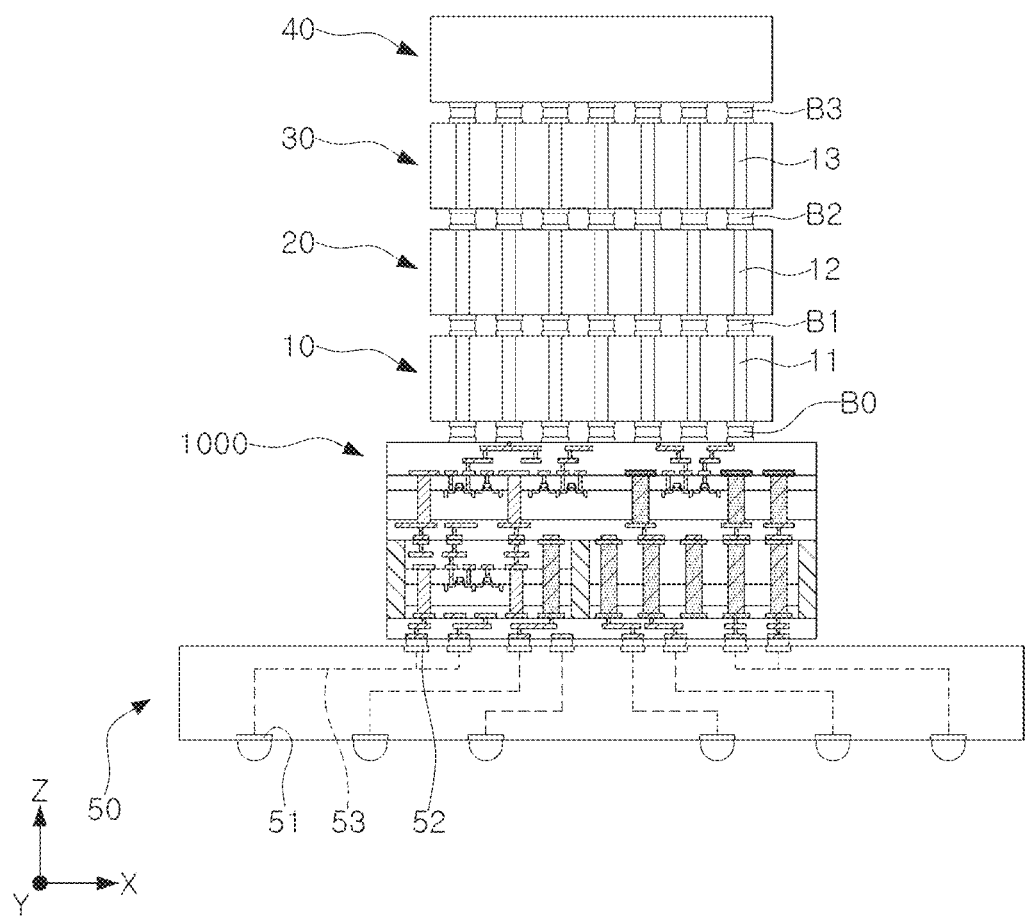
FIG. 10 is a view illustrating a semiconductor package according to an example embodiment.

FIG. 10 is a view illustrating a semiconductor package 2000B according to an example embodiment.

Referring to FIG. 10, the semiconductor package 2000B may include a main semiconductor structure 1000 attached onto a mounting substrate 50 and a plurality of semiconductor chips 10, 20, 30, and 40 stacked in the vertical direction (the Z-axis direction) on the main semiconductor structure 1000. The main semiconductor structure 1000 may be electrically connected to the plurality of semiconductor chips 10, 20, 30, and 40 through connection pads disposed on an upper surface thereof. In FIG. 10, components having the same reference numerals as those of FIG. 9 have characteristics that are the same as or similar to those described above, and an overlapping description thereof is thus omitted.

According to some example embodiments, a semiconductor package in which a voltage drop is decreased, a switching time is shortened, and/or an occupied area is reduced or minimized by disposing a second semiconductor chip for input and output signals and a third semiconductor chip for supplying power on a rear surface of a first semiconductor chip may be provided.

The present inventive concepts are not limited by the disclosed example embodiments and the accompanying drawings, but are to be limited by the claims. Therefore, various substitutions, modifications, and alterations may be made to the disclosed example embodiments by those skilled in the art without departing from the spirit and scope of the present inventive concepts. These substitutions, modifications, and alterations are to fall within the scope of the present inventive concepts.

What is claimed is:

1. A semiconductor package comprising:
   a first semiconductor chip including,
      a first semiconductor layer having a first forward surface and a first rear surface opposing the first forward surface, the first forward surface having a first integrated circuit thereon, and
      a plurality of first through vias penetrating through the first semiconductor layer and electrically connected to the first integrated circuit, the plurality of first through vias including at least a first group of first through vias and a second group of first through vias;
   a second semiconductor chip on the first rear surface of the first semiconductor chip, the second semiconductor chip including,
      a second semiconductor layer having a second forward surface and a second rear surface opposing the second forward surface, the second forward surface having a second integrated circuit thereon, the second integrated circuit electrically connected to the first group of first through vias, and
      second through vias penetrating through the second semiconductor layer and electrically connected to the second integrated circuit;
   a third semiconductor chip on the first rear surface of the first semiconductor chip, the third semiconductor chip including,
      a third semiconductor layer having a third forward surface and a third rear surface opposing the third forward surface, and
      third through vias penetrating through at least parts of the third semiconductor layer and electrically connected to the second group of first through vias; and
   a plurality of connection bumps on the second and third semiconductor chips and electrically connected to at least one of the second through vias and the third through vias,
   wherein the first group of first through vias is configured to transfer input/output signals of the first integrated circuit, and the second group of first through vias is configured to transfer power to the first integrated circuit.

2. The semiconductor package of claim 1, wherein the second forward surface of the second semiconductor chip faces the first rear surface of the first semiconductor chip.

3. The semiconductor package of claim 1, wherein the second semiconductor chip further includes power through vias penetrating through the second semiconductor layer and configured to supply power to the second integrated circuit.

4. The semiconductor package of claim 1, wherein a width of the first group of first through vias is equal to or smaller than that of the second group of first through vias.

5. The semiconductor package of claim 1, wherein a width of each of the second through vias is equal to or smaller than that of each of the third through vias.

6. The semiconductor package of claim 1, further comprising:
   a first encapsulation layer on the first rear surface of the first semiconductor chip and covering side surfaces of each of the second and third semiconductor chips.

7. The semiconductor package of claim 6, further comprising:
   a second encapsulation layer between the plurality of connection bumps and the first encapsulation layer in a first direction perpendicular to the first forward surface, and between the second semiconductor chip and the third semiconductor chip in a second direction perpendicular to the first direction; and
   a redistribution structure in the second encapsulation layer and electrically connecting the plurality of connection bumps to the second semiconductor chip and the third semiconductor chip.

8. The semiconductor package of claim 7, wherein the first encapsulation layer and the second encapsulation layer include different materials.

9. The semiconductor package of claim 1, wherein
   the first integrated circuit includes a logic circuit, and
   the second integrated circuit includes at least one of an input/output circuit, an analog circuit, a memory circuit, or a series-parallel conversion circuit for the logic circuit.

10. The semiconductor package of claim 9, wherein the logic circuit includes at least one of a central processing unit (CPU), a graphics processing unit (GPU), a field programmable gate array (FPGA), a digital signal processor (DSP), an image signal processor (ISP), an encryption processor, a microprocessor, a microcontroller, an analog-to-digital converter, or an application-specific integrated circuit (ASIC).

11. The semiconductor package of claim 9, wherein the memory circuit includes at least one of a dynamic random access memory (DRAM), a static random access memory (SRAM), a phase changing random access memory (PRAM), a magnetic random access memory (MRAM), a resistive random access memory (RRAM), or a flash memory.

12. The semiconductor package of claim 1, further comprising:
   a fourth semiconductor chip on the first rear surface, the fourth semiconductor chip including a fourth semiconductor layer having a fourth forward surface and a fourth rear surface opposing the fourth forward surface, the fourth forward surface having a memory circuit electrically connected to the first integrated circuit thereon and, wherein the plurality of first through vias further include a third group of first through vias electrically connecting the memory circuit and the first integrated circuit to each other.

13. The semiconductor package of claim 12, wherein the memory circuit is electrically insulated from the plurality of connection bumps.

14. The semiconductor package of claim 12, wherein the memory circuit includes a cache memory circuit.

15. The semiconductor package of claim 1, wherein
the third forward surface of the third semiconductor chip faces the first rear surface, and
the third semiconductor chip further includes a circuit structure on the third forward surface, the circuit structure configured to electrically connect the third through vias and the second group of first through vias to each other.

16. A semiconductor package comprising:
a first semiconductor chip including,
  a first semiconductor layer having a first forward surface and a first rear surface opposing the first forward surface, the first forward surface having a first integrated circuit thereon, and
  a plurality of first through vias penetrating through the first semiconductor layer and electrically connected to the first integrated circuit, the plurality of first through vias divided into at least a first group of first through vias and a second group of first through vias;
a second semiconductor chip on the first rear surface of the first semiconductor chip, the second semiconductor chip including,
  a second semiconductor layer having a second forward surface and a second rear surface opposing the second forward surface, the second forward surface having a second integrated circuit electrically connected to the first group of first through vias thereon, and
  second through vias penetrating through the second semiconductor layer and electrically connected to the second integrated circuit; and
a third semiconductor chip on the first rear surface of the first semiconductor chip, the third semiconductor chip including,
  a third semiconductor layer having a third forward surface and a third rear surface opposing the third forward surface, and
  third through vias penetrating through at least parts of the third semiconductor layer and electrically connected to the second group of first through vias,
wherein a width of the first semiconductor chip in a first direction parallel to the first rear surface is equal to or greater than a sum of a width of the second semiconductor chip and a width of the third semiconductor chip in the first direction, and
the second group of first through vias and the third through vias are configured to supply power to the first integrated circuit.

17. The semiconductor package of claim 16, wherein
the second and third semiconductor chips are provided as an integral semiconductor structure, and
the width of the first semiconductor chip in the first direction is greater than that of the integral semiconductor structure in the first direction.

18. The semiconductor package of claim 16, wherein
the second and third semiconductor chips are provided as an integral semiconductor structure, and
the width of the first semiconductor chip in the first direction is same as that of the integral semiconductor structure in the first direction.

19. The semiconductor package of claim 16, wherein the second semiconductor chip and the third semiconductor chip are spaced apart from each other in the first direction.

20. A semiconductor package comprising:
a first semiconductor chip including,
  a first semiconductor layer having a first forward surface and a first rear surface opposing the first forward surface, the first forward surface having a first integrated circuit thereon, and
  a plurality of first through vias penetrating through the first semiconductor layer and electrically connected to the first integrated circuit, the plurality of first through vias including at least a first group of first through vias, a second group of first through vias, and a third group of first through vias;
a second semiconductor chip including a second semiconductor layer, the second semiconductor chip being on the first semiconductor chip so that a second forward surface faces the first rear surface, the second semiconductor layer including,
  the second forward surface and a second rear surface opposing the second forward surface, the second forward surface having a second integrated circuit electrically connected to the first group of first through vias thereon, and
  second through vias penetrating through the second semiconductor layer and electrically connected to the second integrated circuit;
a third semiconductor chip including a third semiconductor layer, the third semiconductor chip being on the first semiconductor chip so that a third forward surface faces the first rear surface, the third semiconductor chip including,
  the third forward surface and a third rear surface opposing the third forward surface, and
  third through vias penetrating through the third semiconductor layer and electrically connected to the second group of first through vias; and
a fourth semiconductor chip including a fourth semiconductor layer, the fourth semiconductor layer being on the first semiconductor chip so that a fourth forward surface faces the first rear surface, the fourth semiconductor layer having the fourth forward surface and a fourth rear surface opposing the fourth forward surface, the fourth forward surface having a memory circuit electrically connected to the third group of first through vias thereon,
wherein the second semiconductor chip is configured to transfer input/output signals of the first integrated circuit, the third semiconductor chip is configured to supply power to the first integrated circuit, and the fourth semiconductor chip is configured to provide cache information to the first integrated circuit.

* * * * *